(12) United States Patent
Negishi

(10) Patent No.: US 6,388,703 B1
(45) Date of Patent: May 14, 2002

(54) METHOD OF REALIZING MACHINING RESULTS

(75) Inventor: Katsuharu Negishi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/361,208

(22) Filed: Jul. 27, 1999

(30) Foreign Application Priority Data

Aug. 3, 1998 (JP) ............................................. 10-218912

(51) Int. Cl.$^7$ ................................................. H04N 7/18
(52) U.S. Cl. ........................ 348/87; 348/126; 348/161; 382/145
(58) Field of Search ......................... 348/87, 126, 129, 348/161; 382/145; H04N 7/18

(56) References Cited

U.S. PATENT DOCUMENTS 3,849,596 A * 11/1974 Lawrence .................... 348/161
4,342,090 A *  7/1982 Caccoma et al. ............. 348/87

* cited by examiner

*Primary Examiner*—Howard Britton
(74) *Attorney, Agent, or Firm*—Rader, Fishman & Grauer, PLLC

(57) ABSTRACT

Disclosed is a method of realizing machining results of a given workpiece. It comprises the steps of: obtaining an image of a selected area in the workpiece before a required machining is performed; obtaining an image of the selected area in the workpiece after the required machining has been performed; making a comparison between these pre- and post-machining images of workpiece to derive non-common portions from the comparison; and realizing how the machined portion or portions in the selected area are like.

3 Claims, 3 Drawing Sheets

METHOD OF REALIZING MACHINING RESULTS

BACKGROUND OF THE INVENTION

1. Field of the Invention

The present invention relates to a method of realizing machining results of a given workpiece, and more particularly a method of realizing machining results from visual recognition of the difference between the pre-machining state and the post-machining state of a given workpiece.

2. Related Arts

FIG. 4 shows how a semiconductor wafer W to be diced is like. As shown, it has a lattice pattern formed thereon, defining a plurality of squares by crossing streets S. The semiconductor wafer is cut into small squares or chips from which integrated circuits can be fabricated.

Some chips may be contaminated with debris, which is the remains of semiconductor material broken to minute pieces when the semiconductor wafer is being cut. The so contaminated chips must be rejected as being of poor quality. Therefore, microscopic examination is required to make a decision as to whether or not each semiconductor wafer has grooves free of such debris or whether or not it is contaminated elsewhere with debris.

From microscopic photographs, however, minute pieces of remains are hardly distinguishable from portions of micro-circuit patterns formed on small squares in the semiconductor wafer. This is the cause for a wrong decision on the permissibility of chips.

The same trouble may be caused in machining other than the dicing of semiconductor wafers.

There has been, therefore, an ever increasing demand for realizing the post-machining state of a given workpiece with accuracy.

SUMMARY OF THE INVENTION

One object of the present invention is to provide a method of realizing the post-machining state of a given workpiece with accuracy.

To attain this object a method of realizing machining results of a given workpiece according to the present invention comprises the steps of: obtaining an image of a selected area in the workpiece with picture-taking means before a required machining is performed on the workpiece; obtaining an image of the selected area in the workpiece with picture-taking means after the required machining has been performed on the workpiece; making a comparison between the image prior to the required machining and the image post of the required machining to derive non-common portions from the comparison; and realizing how the machined portion or portions in the selected area are like.

The workpiece may be a semiconductor wafer; the required machining may be the dicing of the semiconductor wafer; the selected area may be streets on which cutting is effected to separate the semiconductor wafer into small squares or dice; and state of grooves in the semiconductor wafer resulted by cutting is realized.

The workpiece may be a semiconductor wafer; the required machining may be the dicing of the semiconductor wafer; the selected area may be in the semiconductor wafer; and state of contaminant scattered and attached on the semiconductor wafer is realized.

Only the portions of the workpiece which are changed as a result of machining are left for inspection by removing the portions which remain unchanged in the workpiece, thus permitting one to make a correct determination on the post-machining state of the workpiece. In dicing a semiconductor wafer one can have a clear image of each groove shape and width and of minute particles of semiconductor material broken from the semiconductor wafer.

Other objects and advantages of the present invention will be understood from the following description of the manner in which the machining results of a given semiconductor wafer can be realized according to the present invention, which manner is illustrated in accompanying drawings.

DETAILED DESCRIPTION OF PREFERRED EMBODIMENT

Figure 1:
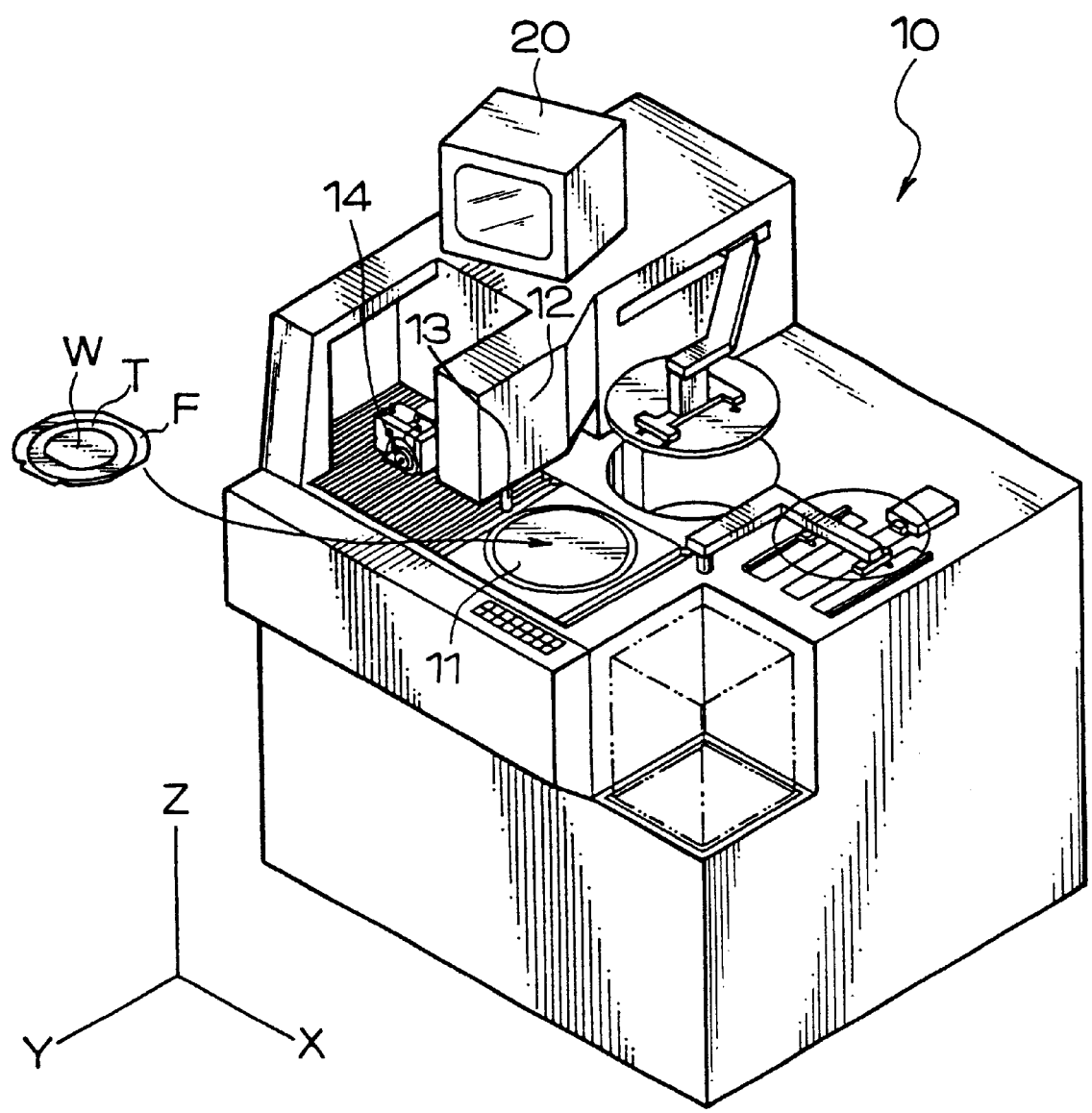
FIG. 1 illustrates one example of a dicing apparatus to which the present invention can be applied.
Figure 4:
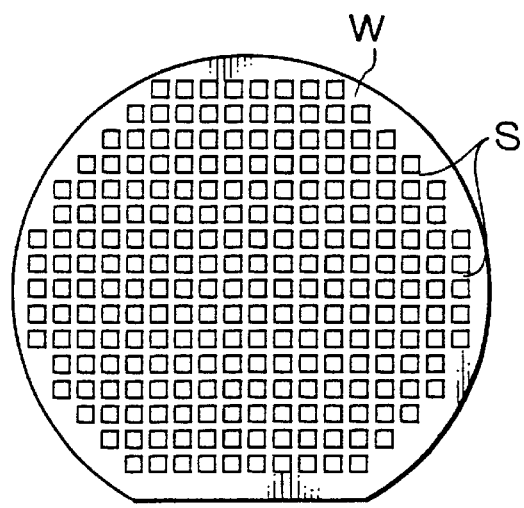
FIG. 4 is a plane view of a semiconductor wafer having a lattice pattern to be cut.

Referring to FIG. 1, a dicing apparatus 10 is used in cutting a semiconductor wafer W into small squares. Its rotary blade cuts the wafer W along the crossing streets S as shown in FIG. 4.

The semiconductor wafer W is fixedly held on a frame F by using an adhesive tape T, and the frame F is sucked and fixedly held on the chuck table 11 of the dicing apparatus 10. Then, the chuck table 11 is moved in the X-direction to be brought just under aligning means 12, and a picture is taken of the semiconductor wafer W with picture-taking means such as a CCD camera. The picture thus taken is shown on a monitor screen 20.

The semiconductor wafer W has a target pattern formed for alignment use. The aligning means 12 is equipped with memory means, in which the target pattern is stored prior to dicing.

The picture-taking means 13 moves in the y-axis direction while taking pictures sequentially, and the pictures of the semiconductor wafer W thus taken are examined sequentially to realize that the semiconductor wafer W comes to alignment position in terms of the target pattern, which is formed on the semiconductor wafer W and is stored in the memory associated with the aligning means 12. The pattern matching thus confirmed indicates that the first street S is aligned with a rotary blade 14, and the picture of the semiconductor wafer W taken by the picture-taking means 13 at the time of alignment is stored in the memory (the first step).

Then, the chuck table 11 is moved in the X-axis direction to allow the rotary blade 14 to cut the first street S. Every time the rotary blade 14 has cut the street S, the rotary blade 14 is shifted the inter-street distance in the Y-axis direction, and the table chuck 11 is shifted in the X-axis direction. Thus, streets S are cut one after another. The chuck table 11 is rotated 90 degrees. The same procedure is repeated to cut streets S one after another so that the semiconductor wafer W is cut crosswise into small squares.

After dicing the semiconductor wafer W the picture-taking means 13 takes a picture of the same area of the semiconductor wafer W as it took the picture of at the first stage (the second stage). A comparison is made between the pre-dicing picture and the post-dicing picture to derive the portions which do not appear in common in these pre- and post-dicing pictures (the third step). From the non-common portions one can realize how the semiconductor wafer W is contaminated with debris, and how the grooves are made along the crossing streets S in the semiconductor wafer W (the fourth step).

When it is desired that the state in which the semiconductor wafer W is contaminated with debris is determined, the picture-taking means takes a picture of a selected area of the semiconductor wafer W prior to the dicing (the first step). If the picture of the selected area is taken at the time of alignment, the selected area contains the alignment pattern 15 as seen from FIG. 2A. As a matter of course, a pre-dicing picture can be taken at any time other than the time of alignment.

After the semiconductor wafer W is diced as described above, and when the occasion demands, the chuck table 11 and the picture-taking means 13 are moved to leave the cutting position to allow the picture-taking means 13 to take a picture of the same selected area as taken prior to the dicing (the second step). The picture thus taken is seen from FIG. 2B, showing that a groove 16 is made along the vertical street S1. And that a groove 17 is made along the horizontal street S1. The chips thus machined are contaminated with minute fragments of semiconductor material C1 to C5.

Figure 2A:
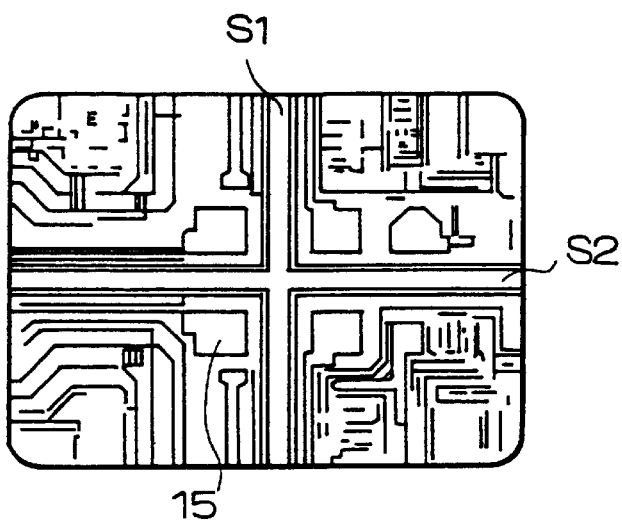
FIGS. 2A, 2B and 2C illustrate how the dicing result can be realized.
Figure 2B:
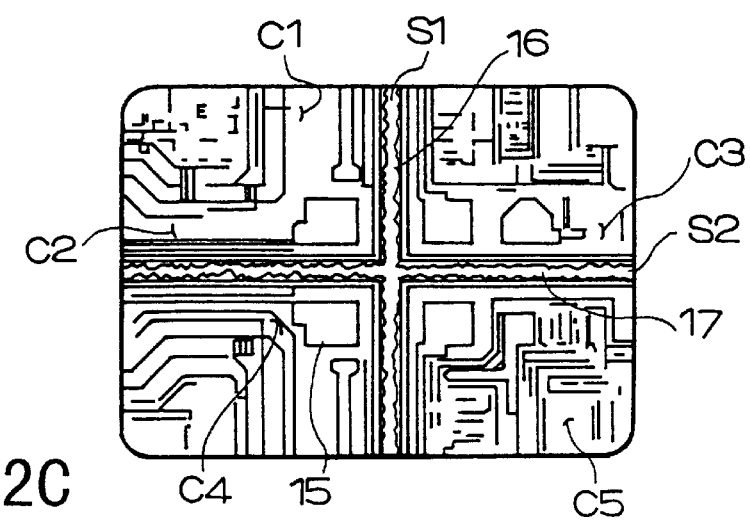
Figure 2C:
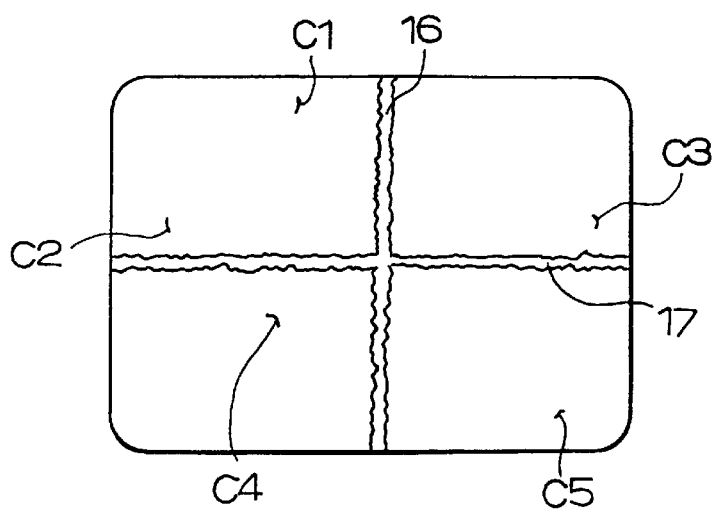

Non-common portions (see FIG. 2C) are derived by eliminating portions which are common in the pre- and post-dicing pictures (see FIGS. 2A and 2B). As seen from FIG. 2C, the circuit pattern and target pattern are excluded to leave the images of the grooves 16 and 17 and minute fragments of semiconductor material C1 to C5 as non-common portions (the third step).

The minute fragment C4 is too close to the circuit pattern to realize from the picture of FIG. 2B, but the picture of non-common portions permits one to locate the minute fragment C4 with ease (the fourth step).

To scrutinize how the width and shape of a selected groove are like and how the groove is contaminated with debris an enlarged picture of the selected street S1. is taken prior to the dicing (see FIG. 3A) to be stored in the memory (the first step). The street S1. has an alignment mark 18 formed therein. The diamond-shaped mark 18 has its opposite horizontal corners put in contact with the opposite sides of the street S1., as seen from FIG. 3A.

After a groove 19 is made along the street S1., a picture of the street S1. is taken. The groove 19 made in the street S1. And the remains of diamond-shaped mark 18 appear in the picture, as shown in FIG. 3B (the second step).

Figure 3A:
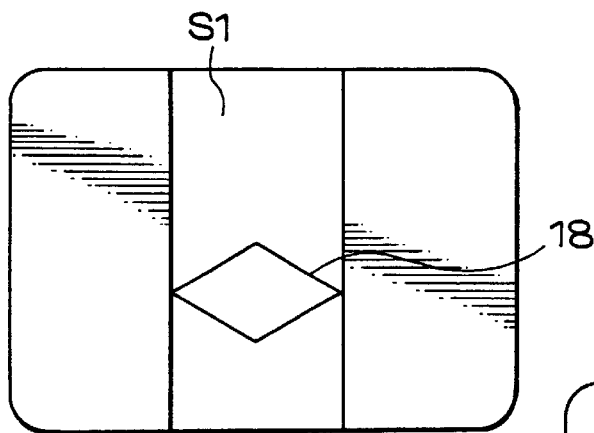
FIGS. 3A, 3B and 3C illustrate how a selected groove made in a semiconductor wafer is realized.
Figure 3B:
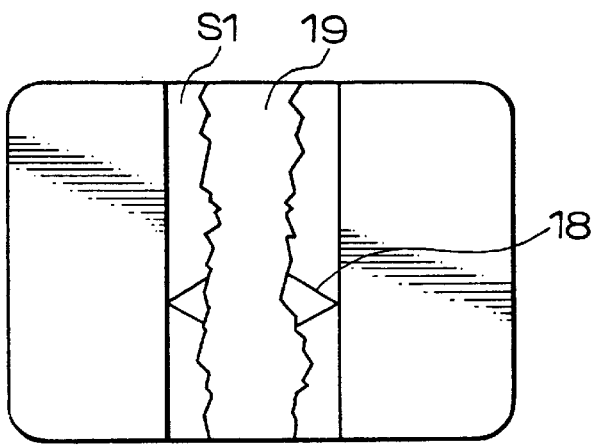
Figure 3C:
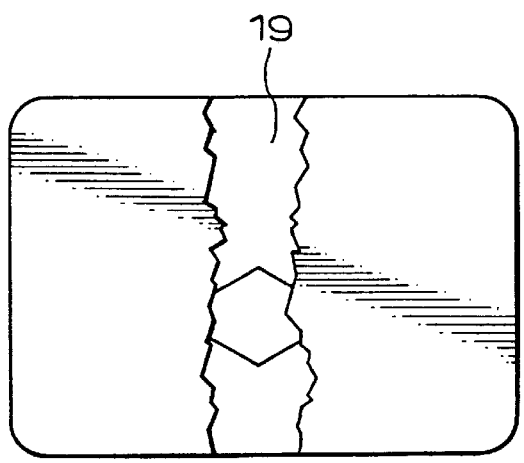

The non-common portions can appear by removing the portions which are in common in the pictures of FIGS. 3A and 3B (the third step). As seen from FIG. 3C, the non-common portions consist of the image of groove 19 only.

Elimination of the common portions from the pre- and post-pictures effectively prevents erroneous realization of the alignment mark 18 as a part of the groove 19, which erroneous realization otherwise, would be actually taken place in the conventional pattern-recognition. Thanks to elimination of common portions the shape of a selected groove and presence of minute fragments of semiconductor material can be determined clearly at sight. Further processing of images permits the groove width to be determined with accuracy (the fourth step).

The pattern recognition method according to the present invention is described as being applied to the dicing of semiconductor wafers. The present invention can be equally applied to the machining of materials other than the dicing of semiconductor wafers.

What is claimed is:

1. A method of realizing machining results of a given workpiece comprising the steps of:

obtaining an image of a selected area in the workpiece with picture-taking means before a required machining is performed on the workpiece;

obtaining an image of the selected area in the workpiece with picture-taking means after the required machining has been performed on the workpiece;

making a comparison between the image prior to the required machining and the image post of the required machining to derive non-common portions from the comparison; and realizing how the machined portion or portions in the selected area are like.

2. A method of realizing machining results of a given workpiece according to claim 1 wherein the workpiece is a semiconductor wafer; the required machining is dicing of the semiconductor wafer; the selected area is streets on which cutting is effected to separate the semiconductor wafer into small squares or dice; and state of grooves in the semiconductor wafer resulted by cutting is realized.

3. A method of realizing machining results of a given workpiece according to claim 1 wherein the workpiece is a semiconductor wafer; the required machining is dicing of the semiconductor wafer; the selected area is anywhere in the semiconductor wafer; and state of contaminant scattered and attached on the semiconductor wafer is realized.

* * * * *